United States Patent
Green et al.

(10) Patent No.: US 6,624,009 B1
(45) Date of Patent: Sep. 23, 2003

(54) FORMING A CRYSTALLINE SEMICONDUCTOR FILM ON A GLASS SUBSTRATE

(75) Inventors: Martin Andrew Green, Waverly (AU); Zhengrong Shi, Belrose (AU); Paul Alan Basore, Caringbah (AU); JingJia Ji, Croydon (AU)

(73) Assignee: Pacific Solar Pty Limited, NSW (AU)

( * ) Notice: Subject to any disclaimer, the term of this patent is extended or adjusted under 35 U.S.C. 154(b) by 0 days.

(21) Appl. No.: 09/297,502

(22) PCT Filed: Nov. 6, 1997

(86) PCT No.: PCT/AU97/00753

§ 371 (c)(1), (2), (4) Date: Apr. 30, 1999

(87) PCT Pub. No.: WO98/20524

PCT Pub. Date: May 14, 1998

(30) Foreign Application Priority Data

Nov. 6, 1996 (AU) ................................. P03471

(51) Int. Cl.⁷ ............ H01L 21/00; H01L 21/84
(52) U.S. Cl. ............ 438/149; 438/479; 438/166
(58) Field of Search ............. 438/151–166, 438/974, 479

(56) References Cited

U.S. PATENT DOCUMENTS

| | | | |
|---|---|---|---|
| 5,372,860 A | | 12/1994 | Fehlner et al. |
| 5,674,304 A | | 10/1997 | Fukada et al. |
| 6,020,225 A | * | 2/2000 | Ishiu ........................... 438/166 |
| 6,051,453 A | * | 4/2000 | Takemura .................... 438/166 |
| 6,168,980 B1 | * | 1/2001 | Yamazaki et al. .......... 438/162 |

FOREIGN PATENT DOCUMENTS

| | | |
|---|---|---|
| JP | 61-203631 | 9/1986 |
| JP | 63-221610 | 9/1988 |
| JP | 2-297923 | 12/1990 |
| JP | 5-218367 | 8/1993 |
| JP | 07109573 | 4/1995 |

* cited by examiner

*Primary Examiner*—Richard Booth
(74) *Attorney, Agent, or Firm*—Jordan and Hamburg LLP (57) ABSTRACT

A method of crystallizing amorphous silicon on a glass substrate relies on deliberately heating the glass substrate above its strain point during processing, making low temperature glasses, such as soda lime glasses, ideal for such use. Since the glass is plastic above this temperature while the silicon remains elastic, the glass is forced to conform to the shape defined by the silicon once this temperature is exceeded. This process relaxes any stresses which might otherwise be created in the glass or film, as long as the glass temperature is above the strain point. As the glass temperature is reduced back below the strain point, the glass becomes progressively more rigid and stresses will begin to build up in the film and glass. When cooled slowly, the stress in the film and the glass can be controlled by appropriate selection of a thermal expansion coefficient of the glass relative to that of silicon, particularly those with linear expansion coefficients in the range 4–10 ppm/° C. below the strain point.

90 Claims, 3 Drawing Sheets

FORMING A CRYSTALLINE SEMICONDUCTOR FILM ON A GLASS SUBSTRATE

INTRODUCTION

The present invention relates generally to the field of semiconductor devices and in particular the invention provides an improved method for the formation of crystalline films on glass substrates.

BACKGROUND OF THE INVENTION

Considerable attention internationally is being directed towards developing technology for depositing polycrystalline silicon films on glass. This interest arises from the use of these films for forming electronic devices and circuits for active matrix liquid crystal displays and for use of these films in solar cells. Silicon film thickness could be in the 30 nm to 100 µm range depending on application. For solar cell use, silicon film thickness in the 0.5–100 µm range is of particular interest, with optimal designs likely to be in the 1–5 µm range.

As part of these efforts, considerable attention is being directed to the development of supporting glass substrates with specific properties, particularly in relation to the thermal expansion coefficient of the glass relative to silicon and the strain point of the glass (temperature at which viscosity reaches a value of $10^{14.5}$ poise). For example, Corning Glassworks have developed a barium alumina silicate glass known as Corning 1737 of strain point above 660!C with a thermal expansion coefficient closely matched to silicon below this temperature for use in active matrix liquid crystal displays; the Max Planck Institute in Stuttgart has developed a glass of unspecified composition which has a strain point of 820!C and a thermal expansion coefficient even better matched to silicon below this temperature for use in solar cells.

A surprising conclusion from research of the present inventors is that this earlier work is heading in the wrong direction. Because amorphous silicon shrinks irreversibly when crystallised, use of a high-strain point glass as a substrate will result in a highly stressed film prone to cracking, even if it is perfectly expansion matched. The present invention arises from the realisation by the inventors that the normal soda lime glasses, developed over the centuries largely to produce durable glass which could be manufactured at low processing temperatures, and hence having low strain points, are ideal for this application. Throughout this specification, the term 'amorphous silicon' is used to describe silicon and silicon alloys containing a high proportion of amorphous silicon such that the material displays the shrinkage characteristic of amorphous silicon material upon its crystallisation. However, the material may include a proportion of crystalline silicon (eg Crystalitec) as well as alloying substances and impurities.

STATEMENT OF INVENTION

According to a first aspect, the present invention provides a method of forming a thin film of crystalline semiconductor material on a glass substrate, including the steps of:
  depositing a film of the semiconductor material in amorphous form over the glass substrate;
  processing the semiconductor material to form crystalline semiconductor material;
  during or subsequently to the processing step, heating the substrate and semiconductor material to a temperature at or above the strain point temperature of the substrate;
  subsequently to the heating step, cooling the substrate and semiconductor material to a temperature below the strain point of the substrate.

According to a second aspect, the present invention provides a method of forming a thin film of crystalline semiconductor material on a glass substrate, including the steps of:
  a) heating the glass substrate to a temperature at which deposition of the crystalline semiconductor material may occur;
  b) depositing a film of the crystalline semiconductor material over the glass substrate;
  c) during or subsequently to the depositing step, heating the substrate and semiconductor material to a temperature at or above the strain point temperature of the substrate;
  d) subsequently to the heating step, cooling the substrate and semiconductor material to a temperature below the strain point of the substrate.

According to a third aspect, the present invention provides a method of forming a thin film of crystalline semiconductor material on a glass substrate, including the steps of:
  a) heating the substrate to a temperature at or above the strain point temperature of the substrate;
  b) after the heating step and while the substrate is still at or above the strain point temperature depositing a film of the crystalline semiconductor material over the glass substrate;
  c) subsequently to the deposition step, cooling the substrate and semiconductor material to a temperature below the strain point of the substrate.

According to a fourth aspect, the present invention provides a method of processing an amorphous semiconductor film on a glass substrate to crystallise the film, the method including the steps of:
  a) processing the semiconductor material to form crystalline semiconductor material;
  b) during or subsequently to the processing step, heating the substrate and semiconductor material to a temperature at or above the strain point temperature of the substrate;
  c) subsequently to the heating step, cooling the substrate and semiconductor material to a temperature below the strain point of the substrate.

According to a fifth aspect, the present invention also provides a method of forming a thin film of crystalline semiconductor material supported by a glass substrate, including the steps of:
  a) forming a low strain point temperature film over the substrate;
  b) depositing a film of amorphous semiconductor material over the low strain point temperature film;
  c) processing the semiconductor material film to form crystalline semiconductor material film.

According to a sixth aspect, the present invention also provides a device manufactured according to any one of the above methods.

According to a seventh aspect, the present invention further provides a semiconductor device including a film of crystalline semiconductor material formed on a glass substrate the substrate having a strain point temperature below the desired crystallisation temperature of the semiconductor material and a temperature co-efficient not less than that of the semiconductor material.

Preferably the substrate is a glass having a strain point temperature below the desired crystallisation temperature of the semiconductor material.

In this context desired crystallisation temperature is the temperature at which crystallisation occurs to achieve desired crystalline characteristics. In one method according to the invention, during or after the crystallisation step the substrate is heated to a temperature where it will deform under gravity against a planar form, within a predetermined processing period, to reverse buckling caused by differential stress between the substrate and the semiconductor film. This temperature will be somewhere between the strain point and the working point of the glass, the temperature used being dependent upon the speed with which the glass is required to flatten. Using this method the substrate can also be placed on a shape form to produce purpose shaped panels for applications such as vehicle sun roofs. In the case of soda lime glass the temperature used with good effect in one embodiment of the invention is 650° C.

In another method according to the invention, during or after the crystallisation step the substrate is heated to a temperature at or above the strain point temperature but below the sagging temperature. The sagging temperature is the temperature where it will deform under gravity within a predetermined processing period. Using this alternative method films can be successfully processed with a maximum temperature of 620° C. This method may be performed with the substrate clamped to a supporting form to reduce buckling.

In another method according to the invention the cooling step includes a step of rapidly cooling the surface of the substrate carrying the semiconductor film. Preferably also the cooling step includes a step of rapidly cooling the surface of the substrate opposite to the surface carrying the semiconductor film. In this context rapid cooling is intended to indicate cooling at a rate at which the glass is not substantially isothermal whereby the glass is also tempered by the cooling process. For 3 mm soda lime glass a rate slower than in the order of 0.5° C./sec would be considered isothermal. However this value will vary according to the type of glass and its thickness. The rate will vary approximately as the square of thickness such that for 1 mm glass isothermal cooling will occur at rates slower than in the order of 5° C./sec while for 10 mm thick glass isothermal cooling will occur at rates slower than in the order of 0.05° C./sec. Throughout this specification, cooling which is referred to as greater than the rate at which isothermal cooling will occur will be taken to be at a rate at or above a rate for the particular glass thickness which corresponds to those rates given above for 1, 3 & 10 mm glass respectively, and which results in a significant temperature gradient across the thickness of the glass during the cooling process.

In the case of 3 mm soda lime glass a typical cooling rate in the region from 20° C. above the strain point to 20° C. below the strain point would be such that the transition took in the order of 10 seconds (ie 4° C./sec) but rates in the range 0.5° C. to 10° C./sec can be applied to good effect. At temperatures further from the strain point cooling may take place at higher or lower rates depending upon other processing requirements.

In one embodiment of the invention, the surface of the substrate on which the semiconductor film is formed is modified to make it more fluid at low temperatures. The surface may be modified by the addition or removal of selected chemical species or by high energy irradiation. Alternatively a low strain point layer can be deposited onto the substrate surface prior to formation of the semiconductor film.

Preferably the semiconductor film is a film of doped or undoped silicon or silicon alloy material. In one application of the invention the silicon film is formed as a plurality of different doped layers of silicon forming one or more rectifying junctions arranged as a photovoltaic device, or solar cell.

The silicon film may be formed by methods such as plasma enhanced chemical vapour deposit or sputtering amongst others.

Silicon film thicknesses with a lower limit of 0.1 $\mu$m can be employed in various embodiments covering a range of applications however preferably in photovoltaic applications films with a lower limit of 0.5 $\mu$m and most desirably a lower limit of 1 $\mu$m are employed.

A practical upper limit for film thickness is 100 $\mu$m however for solar cell devices a preferred upper limit of film thickness is 151 $\mu$m.

The method of invention can be performed with glasses having a strain point below the melting point of silicon, however it is more desirable that the substrate have a strain point below or at least not significantly above the desired crystallisation temperature of the silicon film (approx 600° C.).

The best effect of the invention is achieved when the substrate has a temperature co-efficient not less than that of the crystalline semiconductor material, at least for temperatures below the strain point temperature of the substrate.

Preferably the substrate will be soda lime glass or a similar glass having a strain point temperature at or below 520° C., an annealing point of approximately 550° C. and a temperature co-efficient of 4–10 ppm/° C.

Soda lime glasses with a composition of 70–75% by weight $SiO_2$, 10–20% $Na_2O$, 3–15% CaO and less than 0.2% by weight $Fe_2O_3$ have been found to be effective in performing the invention while low iron glasses having less than 0.1% $Fe_2O_3$ have been found to be particularly advantageous when the approach is used to form solar cells. Preferably, glass with a thickness in the range of 2–4 mm will be used.

In one alternative embodiment, an intermediate layer is formed between the substrate and the semiconductor film, the intermediate layer having a low strain point and a thickness in the range of 0.1–10 $\mu$m. As well as providing strain relief at lower temperatures the intermediate layer can be used to act as a chemical barrier layer and/or anti reflection layer. Intermediate layers such as nitride layers, that do not contribute strain relief at low temperatures can also be included without substantially interfering with the process described.

In the embodiments described above and in the following detailed description, the glass substrate may become the superstrate in a final product. For example, in the case of a solar cell, the cell may be illuminated through the glass layer.

BRIEF DESCRIPTION OF THE DRAWINGS

Embodiments of the invention will now be described in greater detail with reference to the accompanying drawings in which.

In these drawings, the glass substrate is assumed to be several millimetres thick so that at temperatures below the strain point, deformation due to elastic stress is negligible. If the glass were very thin, typically less than 1 mm, then the glass would develop a curvature caused by residual stress at the end of the process. For compressive stress in the film, the glass would bend away from the film side, while for tensile stress, the glass would bend toward the film side.

DETAILED DESCRIPTION OF EMBODIMENTS OF THE INVENTION

The invention will now be described in detail with specific examples using soda lime glass and with reference to Corning 1737 glass by way of comparison, however the invention is equally applicable to other low temperature glasses.

Normal Sequence

For polycrystalline silicon active matrix liquid crystal displays, silicon is normally deposited in amorphous form onto a high strain point glass substrate such as Corning 1737. The amorphous silicon is then crystallised without exceeding the temperature of the strain point of the glass either by prolonged heating at low temperature in a furnace or with very short high intensity pulses from a light source such as a laser which result in minimal heating of the glass. Sometimes both of these steps are applied sequentially. The resulting polycrystalline material is then processed into the desired electronic device. By minimising the thermal expansion difference between the glass and the silicon, stresses due to thermal expansion mismatch can be minimised throughout the processing. Since the thermal expansion coefficient of the glass increases greatly once heated above its strain point and the glass can distort above these temperatures, it has been thought important that the strain point not be exceeded during this processing. But, despite this precaution, strong tensile stress is induced in the film due to irreversible shrinkage that occurs during crystallisation.

Film Contraction Upon Crystallisation

Prior art approaches to developing silicon films can only poorly accommodate the contraction of the originally amorphous silicon layer upon crystallisation. Typically, the volume of an amorphous film is 1–3% larger than that of its crystalline counterpart due to the more compact organisation of atoms in the latter. If using a glass with a thermal expansion coefficient matched to silicon, the contraction of the silicon upon crystallisation will create an undesirable tensile stress in the film. This makes the film susceptible to cracking, particularly if it is reasonably thick.

Improved Process

The improved process employed in embodiments of the present invention relies on deliberately heating the glass substrate above its strain point during processing making the low temperature glasses, such as soda lime glasses, ideal for this use. Since the glass is plastic above this temperature while the silicon remains elastic, the glass is forced to conform to the shape defined by the silicon once this temperature is exceeded. This process relaxes any stresses which might otherwise be created in the glass or film, as long as the glass temperature is above the strain point. As the glass temperature is reduced back below the strain point, the glass becomes progressively more rigid and stresses will begin to build up in the film and glass.

If cooled slowly, the stress in the film and the glass can be controlled by appropriate selection of its thermal expansion coefficient relative to that of silicon, particularly those with linear expansion coefficients in the range 4–10 ppm/!C below the strain point. Particularly interesting are glasses with thermal expansion coefficients higher than silicon. Slow cooling will result in a compressive stress in the silicon film which is desirable from the point of view of its mechanical integrity, particularly in relation to a significantly reduced potential for film cracking.

The amount of stress left in the film can be controlled by the rate of cooling. In particular, fast cooling of the film will leave the high temperature structure of the glass frozen into the surface layer, allowing a controlled amount of compressive stress to be generated in the thin film. Simultaneous fast cooling of the opposite glass surface will leave a similar high temperature structure remaining in the glass and leave this surface in compression. The more slowly cooling central regions of the glass layer will be in tension due to the greater contraction of these more slowly cooling regions. This arrangement is particularly desirable for maximising the tolerance of the entire structure to cracking.

Conversely, by choosing a glass with a low strain point, the crystallisation process occurs at a temperature where the glass is soft. The contraction within the silicon film is accommodated by the deformation of the soft glass, removing the tendency for the films to crack and allowing the processing of thick films.

Alternative Implementations

The previous effects could be enhanced by incorporating additional processing features. For example, the surface of the glass onto which the film is to be deposited could be made softer and more easily deformable at low temperatures by several approaches. One could be by chemical modification of the glass such as by the incorporation of additional chemical species or by the removal of selected species from the surface region of the glass. Another may be by surface modification by high energy particle irradiation. This is known to increase the ability of the glass to deform in response to stresses at low temperatures. Alternatively, a low strain point layer could be deposited onto the glass surface prior to the deposition of the silicon film to produce these benefits at even lower temperature than would be possible using uncoated glass.

Experimental Results

Amorphous silicon films have been deposited by several techniques onto both low temperature soda lime glass and higher temperature barium alumina silicate glass (Corning 1737). Films deposited by plasma enhanced chemical vapour deposition have been observed to have an intrinsic compressive stress after deposition as do those deposited by sputtering. This intrinsic stress tends to mildly distort thin glass substrates which are generally elastic at the low deposition temperatures involved. The amount of stress can be measured by measuring the very slight curvature imparted to the glass sheet. Typical values of intrinsic stress combined with the thermal expansion mismatch stress arising from cooling from the deposition temperature to room temperature are in the range 100–600 megapascals (MPa). Other deposition techniques might give rise to different stresses without any impact upon the effectiveness of the approach described. Upon heating, the higher thermal expansion coefficient of the soda lime glass will tend to reduce this compressive stress in the deposited film and even make it tensile, while it will remain virtually unchanged in the barium alumina silicate glass due to its good thermal expansion match to silicon.

If heated to a crystallisation temperature which is above the strain point of the soda lime glass, stresses in the film will relax by glass deformation. The glass will physically deform to adjust its shape to that of the zero stress silicon film. Upon crystallisation, the glass similarly adjusts to the reduced dimensions of the crystallised film. Upon cooling, a compressive stress will build up in the film due to its smaller expansion coefficient compared to that of the much thicker glass substrate. The amount of stress can be controlled by the cooling rate as previously mentioned.

In the case of the higher strain point temperature glass, the silicon film will go into tension when it contracts on crystallisation. This can create cracking in films. Cracking has been observed in films thicker than 4 microns when deposited upon such glass. This tensile stress remains after cooling due to the thermal expansion match during the cooling process. The stresses will not be able to be modified to the same extent by controlling the cooling rate.

Computer Simulations

The interpretation of the experimental results has been aided by the use of the computer simulation package ABAQUS. The general variation of stress in the silicon film as a function of time for thin silicon films deposited onto both high temperature glass with a thermal expansion coefficient matched to silicon (Corning 1737), such as conventionally used in these applications, and a low temperature soda lime glass is shown in FIG. 1.

Figure 1:
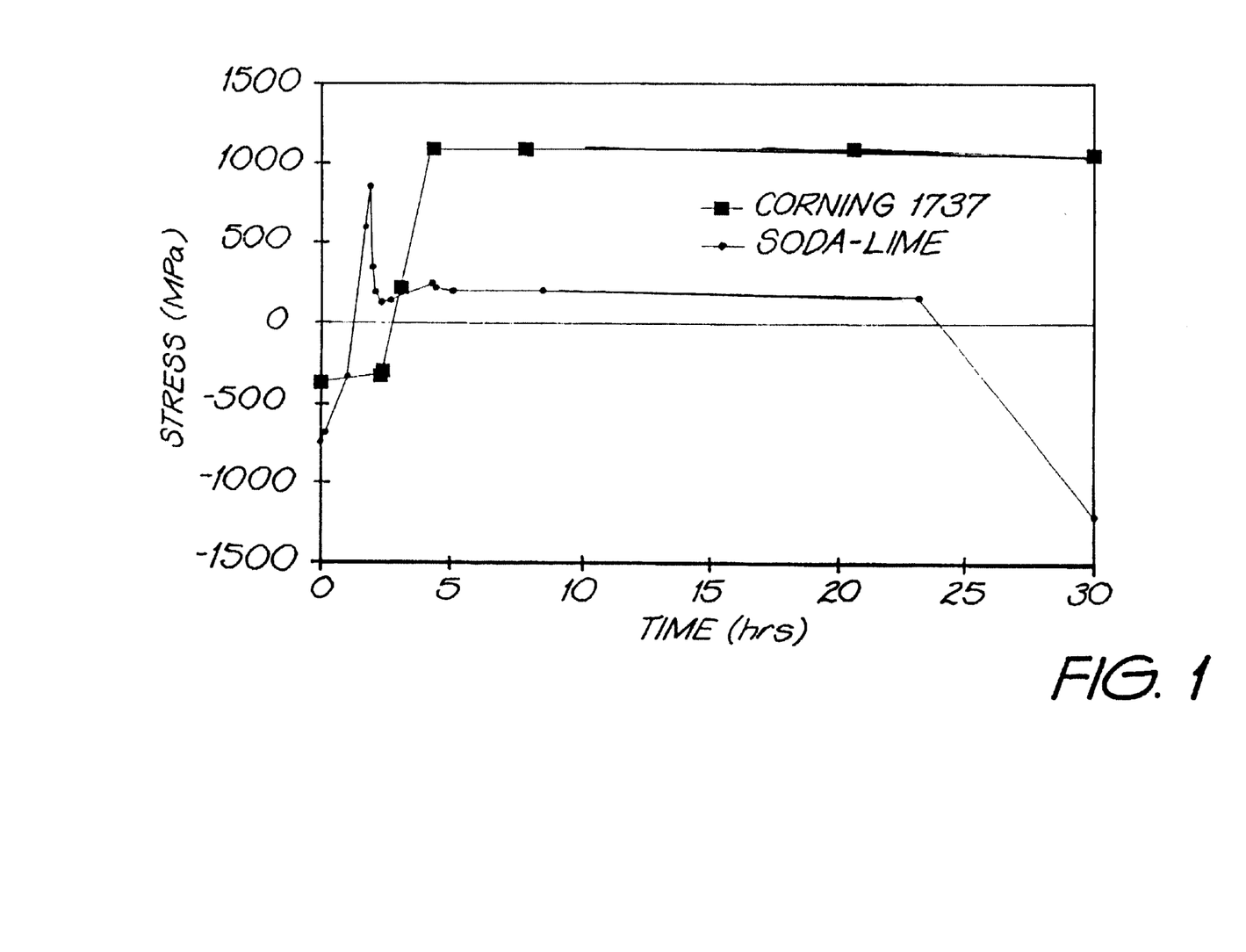
FIG. 1 graphically illustrates a comparison of silicon film stress development for a high-temperature glass (Corning 1737) and a low-temperature glass (soda lime) when subjected to crystallisation of the film at a temperature of 620° C. (Positive stress values indicate tensile stress and negative values indicate compressive stress)

For the case simulated, the silicon films are deposited onto one side of the glass substrates at relatively low temperature in amorphous form, then cooled to room temperature, the starting point in FIG. 1. The film and substrate are then heated to a temperature sufficiently large to allow the amorphous silicon films to crystallise. This temperature is intermediate between the strain points of the low temperature glass and the high temperature glass. After crystallisation is complete, the samples are cooled to room temperature.

The silicon films are generally deposited at intermediate temperatures in the range of 200–500° C. An intrinsic stress is produced in the films during deposition with the magnitude and sign of this stress depending upon the nature of the deposition process and the deposition parameters. For the case of FIG. 1, a compressive intrinsic stress is modelled as frequently observed in experimental films. Stress development has been modelled in FIG. 1 for both Corning 1737 and soda lime glass, with an initial compressive intrinsic stress of −300 MPa at the deposition temperature of the amorphous film.

During cooling to room temperature after deposition, there will be a change in stress levels depending on the relative thermal expansion coefficients of the silicon film and the glass. The stress in the film on the low temperature soda lime glass will become more compressive (approx −700 MPa) than that of the film on the high temperature glass (approx. −350 MPa) due to the much higher thermal expansion coefficient of the former.

During heating to the crystallisation temperature of the film, the stress in the film on the soda lime glass will become more tensile, again due to its lower thermal expansion coefficient than the glass, reaching its maximum tensile value, as shown on FIG. 1. This maximum is attained since the glass viscosity decreases as it is heated, with the glass becoming quite soft and able to relax its structure to accommodate the stress at temperatures above the strain point. The stress in the high temperature Corning 1737 glass will vary only slightly from its room temperature value during the heating stage since the glass is designed to have a similar thermal expansion coefficient to silicon.

The amorphous silicon then begins to crystallise. The compaction of the silicon upon crystallisation will tend to be restrained by the glass producing tensile stresses in the film. This is very apparent in the case of the high temperature glass (Corning 1737) of FIG. 1. The compressive intrinsic stress after deposition converts to a tensile stress during film crystallisation. However, since the low temperature soda lime glass is above its strain point during crystallisation, it is unable to restrain the compaction of the film. Hence, there is very little increase in the tensile stress in the film during crystallisation in this case.

After crystallisation, the film and substrate are cooled to room temperature. For the high temperature glass (Corning 1737), there will be little change in stress levels in the film during cooling since its thermal expansion coefficient is matched to silicon. However, as the soda lime glass cools below its strain point, it becomes more rigid and the higher thermal expansion coefficient of the glass causes the residual tensile stress in the film to become compressive.

Figure 2:
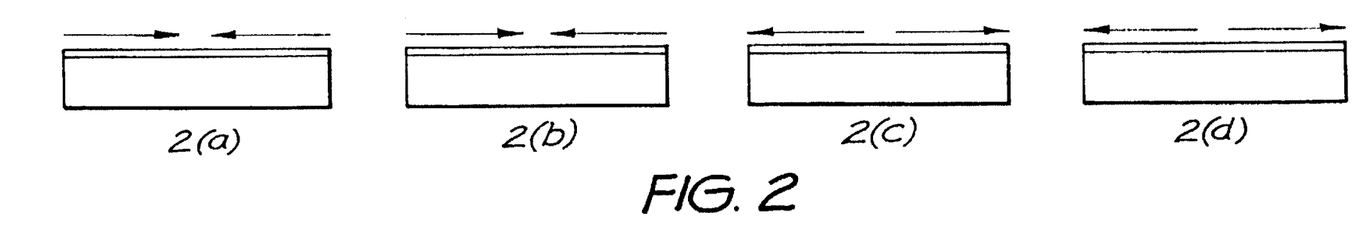
FIGS. 2(a)–(d) diagrammatically illustrate four stages of processing of a silicon film on a Corning 1737 glass substrate.

Referring to FIGS. 2–6 five processes discussed above will be described to examine the stresses existing in a silicon film during raised temperature processing on a glass substrate. Turning firstly to FIG. 2 this series of diagrams shows stress exhibited in a silicon film deposited on a Corning 1737 glass substrate at the following points in a processing sequence, neglecting the slight curvature of the glass caused by the elastic stress described:

2(a) Compressive stress in the amorphous silicon film prior to heating (20° C.);

2(b) Compressive stress in the amorphous silicon at 620° C. prior to crystallisation;

2(c) Tensile stress in the silicon film at 620° C. after crystallisation; and

2(d) Tensile stress in the crystalline silicon film at 20° C. after cooling.

Because Corning 1737 glass has not reached its strain point at 620° C. the compressive stresses shown in FIG. 2(b) and the tensile stresses shown in FIG. 2(c) are not relieved. Further, because this glass has a temperature co-efficient which is closely matched to silicon the tensile stress present at 620° C. in FIG. 2(c) is still present when the substrate and film has been cooled to 20° C. Therefore it will be noted that this glass is not suitable for the process of the present invention as the detrimental tensile stress in the silicon film is not relaxed and remains at the end of the processing sequence.

Figure 3:
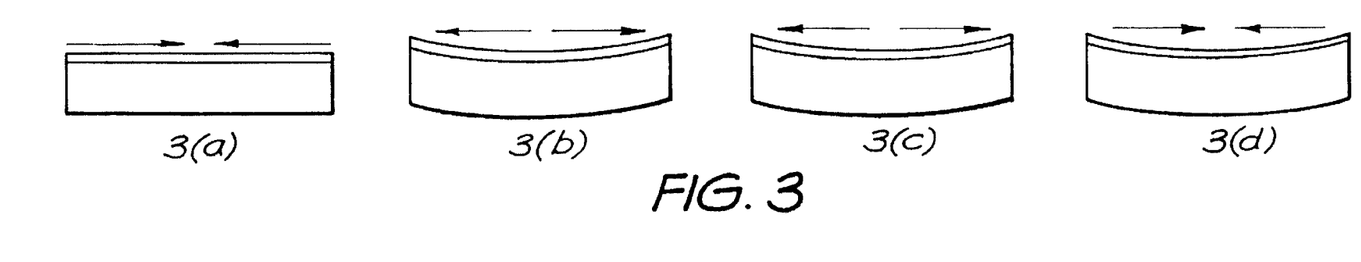
FIGS. 3(a)–(d) diagrammatically illustrate four stages of processing of a silicon film on an unclamped soda lime glass substrate including heating to a temperature above the strain point of the substrate.

In FIG. 3 the same processing points are illustrated as in FIG. 2, but in this case the substrate is soda lime glass and the conditions are as follows:

3(a) Compressive stress in the amorphous silicon film prior to heating (20° C.);

3(b) Due to the higher temperature co-efficient of soda lime glass, tensile stress has developed in the amorphous silicon film as it is heated to 620° C. but prior to crystallisation of the silicon, however the soda lime glass has passed its strain point and bending occurs with significant resultant relief of the tensile stress in the silicon film leaving only a residual stress level remaining;

3(c) After crystallisation at 620° C. the silicon film has contracted but the tensile stress in the film has only increased slightly as the glass has absorbed some of the contraction, resulting in a similar residual stress level to that of FIG. 3(b).

3(d) Cooling of the substrate has frozen the bend in the glass as the temperature passed through the strain point of the glass but at 20° C. the silicon now exhibits a significant compressive stress due to the higher temperature co-efficient of the glass over the silicon.

As opposed to the case with high temperature glass in FIG. 2, the same processing sequence using low temperature glass results in stress relief when the glass is raised above its strain point, with the end result that the silicon film is in compression when the substrate is cooled back to 20° C.

Figure 4:
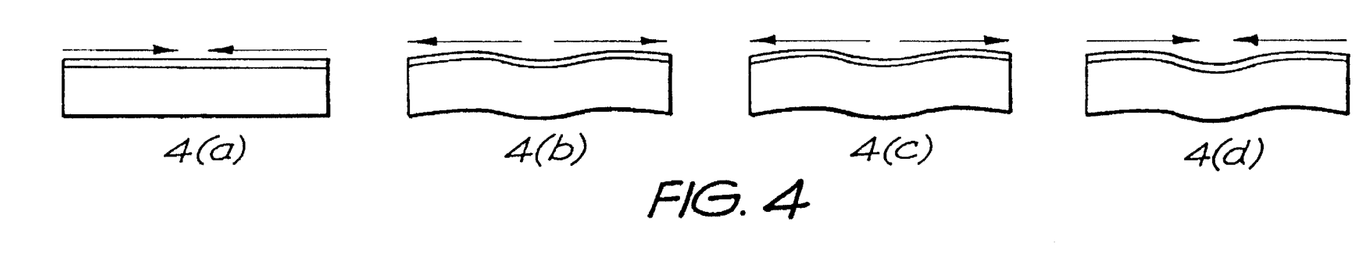
FIGS. 4(a)–(d) diagrammatically illustrate four stages of processing of a silicon film on a clamped soda lime glass substrate including heating to a temperature above the strain point of the substrate.
Figure 5:
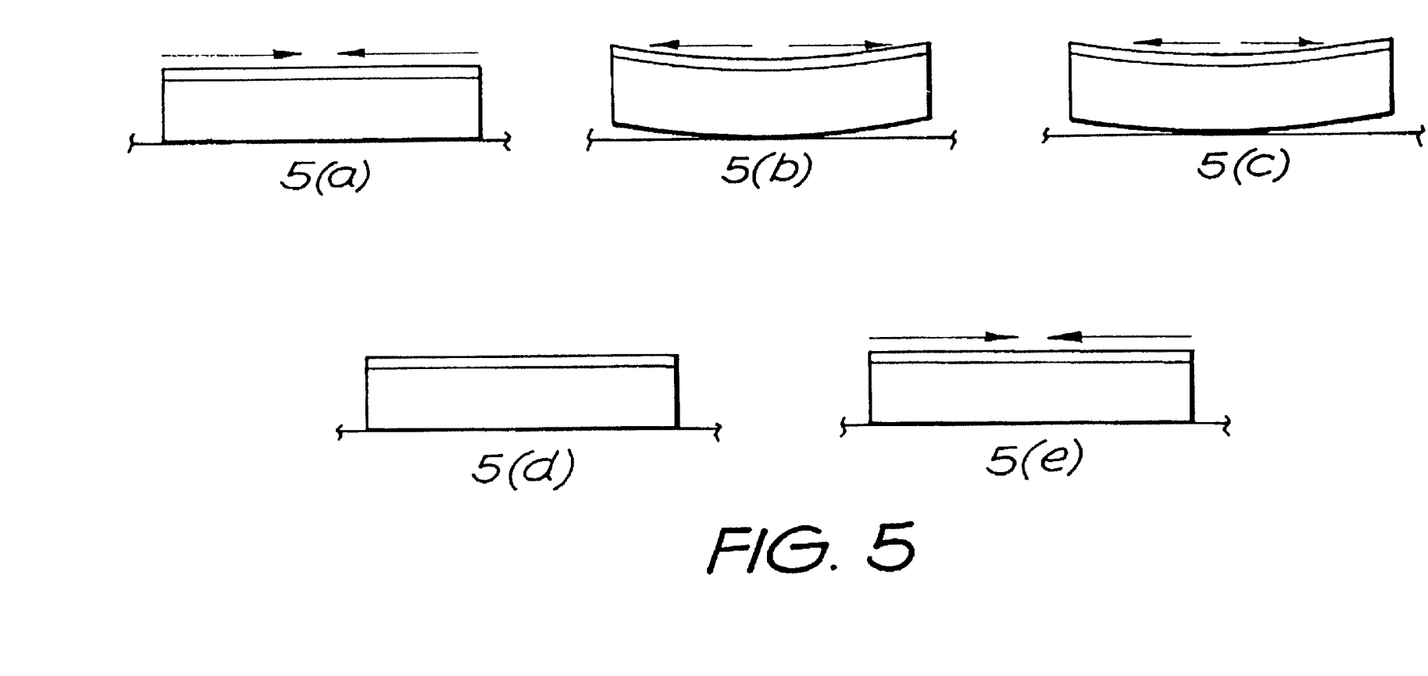
FIGS. 5(a)–(e) diagrammatically illustrate five stages of processing of a silicon film on an unclamped soda lime glass substrate including heating to a temperature above the softening point of the substrate.

The sequence illustrated in FIG. 4 is similar to that of FIG. 3 except that in this case the edges of the substrate are clamped to prevent the bending that was observed in FIGS. 3(a), 3(c) and 3(d).

In the sequence of FIG. 4, some buckling in the centre of the substrate is observed to be introduced at FIG. 4(b) and is retained in FIGS. 4(c) and 4(d) but otherwise the stresses are seen to be substantially equal to those in the sequence of FIG. 3. In the diagrams of FIG. 4 the buckling has been exaggerated for ease of understanding but in reality the buckling will be much less pronounced than the bending described with reference to FIG. 3.

Turning to FIG. 5, this sequence is again performed on a silicon film formed on a soda lime glass substrate, with steps 5(a), 5(b) and 5(c) being as for FIG. 3. However in the sequence of FIG. 5, the additional step illustrated as 5(d) is performed, where the silicon and substrate are heated to 650° C. at which point the glass has softened sufficiently to completely relieve the stress in the silicon, while allowing the glass to flatten under the effect of gravity. Cooling of the substrate then results in the FIG. 5(e) situation where at 20° C. the silicon is again in compression but the substrate is substantially flat.

Other mounting arrangements for the glass can obviously be used to control the distortion of the glass during the thermal processing. For example, turning the film side of the glass downwards (i.e. supporting the panel on the film side) will accelerate the flattening of the distortion in connection with FIG. 5. Constraining the glass by methods other than pinning at the corners could completely eliminate distortion while giving the full benefits of the invention.

Effects of Stresses

There are several potentially undesirable consequences of large stresses in the film including glass distortion, film delamination and film cracking.

The first two depend upon many factors including the stress levels in the film, but will become more likely with increasing film thickness. Film cracking is likely when there is a high tensile stress in the films.

Experimentally, cracking has been observed in films when over 4 microns in thickness when deposited onto high temperature Corning 1737 glass and crystallised, even when initially deposited by techniques such as sputtering which result in a high initial compressive stress in the film.

For the low temperature glass, the maximum film tensile stress occurs as the film is heated to the crystallisation temperature. This stress can be controlled in a number of ways. Control of the heating conditions will allow the use of glass relaxation to minimise the peak value. Prior thermal treatments of the glass which tend to freeze-in a high temperature structure will restrict the tendency for the glass to expand at an increased rate past the strain point temperature. Deposition of the amorphous film with a high compressive stress and at increased temperature will also reduce this maximum tensile stress.

If the low temperature soda lime glass is not constrained at this stage of the processing, distortion of the glass by bending up at the corners can occur to reduce this tensile stress. This distortion can remain through the subsequent thermal cycle. Constraining the glass at the corners prevents this occurring, with a slight buckling of the glass near its centre the only undesirable consequence. Other methods of constraint, such as more uniform loading, could reduce this distortion further.

Alternatively, or in conjunction with such constraints, the deformed glass can be heated to a higher temperature after film crystallisation. The glass will become even softer at such temperatures, allowing gravity to flatten the glass as confirmed by both experimentation and ABAQUS modelling. With rapid subsequent cooling of the glass surfaces, they can also allow the high temperature structure of the glass to be frozen into the glass near the surface, providing a toughening effect as in normal glass tempering. This high temperature step could be integral with the crystallisation step or be conducted subsequently.

Advantages

Due to their lower fabrication temperatures and the very large existing volume of production, the lower strain point high thermal expansion coefficient soda lime glasses are considerably lower in cost than those of the higher temperature thermally matched glasses. Much tighter control over the purity of the elements used to form the latter glasses is also required. Additionally, there is less scope for controlling the stress in the final silicon film by manipulation of cooling rates. The high thermal expansion coefficient glasses also leave the silicon films in a compressive state, which is desirable from mechanical aspects. The use of these glasses also allows a compressive stress to be built into the uncoated surface of the glass which will improve the durability of the film/glass composite in the field.

Although the advantages have been described in relation to silicon that is deposited in amorphous form, other techniques for depositing silicon will also benefit from these advantages. Specifically, films deposited directly in polycrystalline form at high temperature will only have stress arising from thermal expansion mismatch from the strain as the glass is cooled below the strain point. These considerations make it unnecessary to use expensive glasses for the deposition of these films which could have a major impact on both the cost of displays and solar cells.

Specifically, one preferred choice of glass would be the soda lime lasses produced in high volume with a composition containing primarily 70–75% by weight of $SiO_2$, 10–20% $Na_2O$, and 3–15% CaO and with an $Fe_2O_3$ composition of less than 0.2% by weight. Low iron soda lime glass with an $Fe_2O_3$ composition of less than 0.1% is particularly attractive.

Silicon film thickness could be in the 30 nm to 100 μm range depending on application. For solar cell use, silicon film thickness in the 1–100 μm range is of particular interest, with optimal designs likely to lie in the 3–15 μm range.

Strain points of the standard soda lime glasses lie in the 500–520° C. range. Processing above the strain point will give the desirable stress relaxation effects noted. Crystallisation of the silicon can most effectively be conducted in the 530–650° C. range, with longer crystallisation times required at the lower temperatures. Temperature treatment at around 650° C. is sufficiently high for gravity to remove glass distortion in reasonable times. Even higher temperature treatment will further improve the quality of the crystallised films.

These temperatures would be modified in ways obvious to those skilled in the art for glasses other than standard soda lime glasses where stress relaxation benefits were sought and for cases where surface modification or surface films were used to achieve similar benefits.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

What is claimed is:

1. A method of forming a thin film of crystalline material supported on a glass substrate, by processing an amorphous semiconductor film supported by the glass substrate to crystalize the film, the method including the steps of:
    a) processing the semiconductor material to form crystalline semiconductor material;
    b) during or subsequently to the processing step, relaxing stress in the film by heating at least the region of the substrate adjacent to the interface between the substrate and semiconductor material to a temperature at or above the strain point temperature of the substrate, the heating continuing at least until the region of the substrate adjacent to the interface between the substrate and semiconductor material begins to soften; and
    c) subsequently to the heating step, cooling the substrate and semiconductor material to a temperature below the strain point of the substrate.

2. The method as claimed in claim 1, wherein the step of processing the amorphous semiconductor material film includes heating the film to a temperature at which solid phase crystallisation will occur during the period it is heated to this temperature.

3. The method as claimed in claim 1, wherein the semiconductor carrying surface is modified by the addition of an intermediate film over the surface before the semiconductor film is deposited, the intermediate film separating the semiconductor film from the glass substrate.

4. The method of claim 3, wherein the intermediate film has a thickness of 0.1–10 μm.

5. The method of claim 4, wherein the intermediate film acts as a chemical barrier.

6. The method of claim 5, wherein the intermediate film acts as an anti-reflection layer.

7. The method as claimed in claim 1, wherein the surface of the substrate carrying surface is modified by the addition or removal of selected species.

8. The method of claim 1, wherein the semiconductor carrying surface is modified by high energy irradiation.

9. The method as claimed in claim 1, wherein the surface of the substrate supporting the semiconductor film is modified to make it more fluid at low temperatures.

10. The method as claimed in claim 1, wherein the substrate is a glass having a strain point temperature below a temperature at which the processing occurs to cause crystallisation of the semiconductor material.

11. The method as claimed in claim 1, wherein during or after the crystallisation step, the substrate is heated to a temperature at which it will deform under gravity against a planar form, within a predetermined processing period, to reverse buckling caused by differential stress between the substrate and the semiconductor film.

12. The method as claimed in claim 1, wherein during or after the crystallisation step, the substrate is heated to a temperature at which it will deform under gravity against a shaped form, within a predetermined processing period, to reverse buckling caused by differential stress between the substrate and the semiconductor film and to form the substrate to a shape determined by an end use of the device formed from the semiconductor layer.

13. The method of claim 12, wherein the substrate is heated to a maximum temperature between the strain point and the working point of the substrate.

14. The method as claimed in claim 12, wherein the substrate is heated to a maximum temperature which is between the strain point and the sagging temperature of the substrate.

15. The method of claim 14, wherein the substrate is clamped at its edges at least while it is heated above the strain point and during the subsequent cooling step.

16. By The method as claimed in claim 14, wherein the substrate is low temperature glass.

17. The method as claimed in claim 16 wherein the substrate is 1–10 mm thick.

18. The method as claimed in claim 17, wherein the substrate is 1–5 mm thick.

19. The method as claimed in claim 18 wherein surface carrying the semiconductor film is cooled from the maximum temperature to below the strain point at a rate greater than the maximum rate at which isothermal cooling can occur.

20. The method as claimed in claim 19, wherein the rate of cooling from the maximum temperature to below the strain point is in the range of 0.1° C./sec to 10° C./sec.

21. The method as claimed in claim 20, wherein the rate of cooling from the maximum temperature to below the strain point is in the range of 0.5° C./sec to 10° C./sec.

22. The method as claimed in claim 20, wherein the rate of cooling from the maximum temperature to below the strain point is in the order of 4° C./sec.

23. The method as claimed in claim 1, wherein the semiconductor film is a film of material selected from doped or undoped silicon or silicon alloy.

24. The method as claimed in claim 1, wherein the silicon film is formed as a plurality of different doped layers of silicon forming one or more rectifying junctions arranged as a photovoltaic device or solar cell.

25. The method as claimed in claim 24, wherein the lower limit of semiconductor film thickness is 0.1 μm.

26. The method as claimed in claim 24, wherein the lower limit of semiconductor film thickness is 1.0 μm.

27. The method as claimed in claim 24, wherein the lower limit of semiconductor film thickness is 3 μm.

28. The method as claimed in claim 24, wherein the upper limit of semiconductor film thickness is 100 μm.

29. The method as claimed in claim 24, wherein the upper limit of semiconductor film thickness is 15 μm.

30. The method as claimed in claim 24, wherein the strain point of the substrate is below or not significantly above the crystallisation temperature of the silicon film.

31. The method as claimed in claim 24, wherein the substrate has a strain point at or below 520° C.

32. The method of claim 31, wherein the substrate has an annealing point of 550° C.

33. The method of claim 31, wherein the substrate has a temperature coefficient of 4–10 ppm/° C.

34. The method as claimed in claim 24, wherein the substrate is soda lime glass with a composition of 70–75% by weight $SiO_2$, 10–20% $Na_2O$, 3–15% CaO and less than 0.2% by weight $Fe_2O_3$.

35. The method as claimed in claim 34, wherein the composition has less than 0.1% by weight $Fe_2O_3$.

36. The method as claimed in claim 1, wherein the substrate is low temperature glass.

37. The method of claim 36, wherein the substrate is soda lime glass.

38. The method of claim 37, wherein the substrate is heated to a maximum temperature of 650° C.

39. The method of claim 11, wherein the substrate is heated to a maximum temperature between the strain point and the working point of the substrate.

40. The method as claimed in claim 16 wherein the surface carrying the semiconductor film is cooled from the maximum temperature to below the strain point at a rate greater than the maximum rate at which isothermal cooling can occur.

41. The method of claim 16, wherein the substrate is soda lime glass.

42. The method of claim 41, wherein the substrate is heated to a maximum temperature of 620° C.

43. The method of claim 42, wherein the substrate is 2–4 mm thick.

44. The method as claimed in claim 1 wherein:
the substrate is soda lime glass with a composition of 70–75% by weight $SiO_2$ 10–20% $Na_2O$, 3–15% CaO and less than 0.1% by weight $Fe_2O_3$ and the film is formed as a plurality of different doped layers of silicon or silicon alloy forming one or more rectifying junctions arranged as a photovoltaic device or solar cell the substrate having a thickness in the range of 2–4 mm thick and the film having a thickness in the range of 1.0–15 $\mu$m;
the step of relaxing stress includes heating at least the region of the substrate adjacent to the interface between the substrate and semiconductor material to a maximum temperature of 620° C. so as to substantially relax stress in the film; and
the cooling step includes cooling the substrate and semiconductor material to a temperature below the strain point of the substrate at a rate in the order of 4° C./sec.

45. A method of forming a thin film of crystalline semiconductor material directly onto a glass substrate or over an intermediate layer supported by the glass substrate, including the steps of:
a) heating the glass substrate to a temperature at which deposition of the crystalline semiconductor material may occur;
b) depositing a film of the crystalline semiconductor material over the glass substrate;
c) during or subsequently to said step of depositing, relaxing stress in the film by heating at least the region of the substrate adjacent to a surface of the substrate forming an interface between the substrate and semiconductor material to a temperature at or above the strain point temperature of the substrate, the heating continuing at least until the region of the substrate adjacent to the interface between the substrate and semiconductor material begins to soften; and
d) subsequently to the heating step, cooling the substrate and semiconductor material to a temperature below the strain point of the substrate.

46. The method of claim 45 wherein:
the substrate is soda lime glass with a composition of 70–75% by weight $SiO_2$, 10–20% $Na_2O$, 3–15% CaO and less than 0.1% by weight $Fe_2O_3$ and the film is formed as a plurality of different doped layers of silicon or silicon alley forming one or more rectifying junctions arranged as a photovoltaic device or solar cell, the substrate having a thickness in the range of 2–4 mm thick and the film having a thickness in the range of 1.0–15 $\mu$m;
the step of relaxing stress includes heating at least the region of the substrate adjacent to the interface between the substrate and semiconductor material to a maximum temperature of 620° C.; and
the step of cooling includes cooling the substrate and semiconductor material to a temperature below the strain point of the substrate at a rate in the order of 4° C./sec.

47. The method as claimed in claim 45, wherein the semiconductor carrying surface is modified by the addition of an intermediate film over the surface of the substrate before the semiconductor film is deposited, the intermediate film separating the semiconductor film from the glass substrate.

48. The method of claim 47, wherein the intermediate film has a thickness of 0.1–10 $\mu$m.

49. The method of claim 48, wherein the intermediate film acts as a chemical barrier.

50. The method of claim 49, wherein the intermediate film acts as, an anti-reflection layer.

51. The method as claimed in claim 45, wherein the semiconductor carrying surface of the substrate is modified by the addition or removal of selected species.

52. The method of claim 45, wherein the semiconductor carrying surface of the substrate is modified by high energy irradiation.

53. The method as claimed in claim 45, wherein the semiconductor carrying surface of the substrate is modified to make it more fluid at low temperatures.

54. The method as claimed in claim 45, wherein the substrate is a glass having a strain point temperature below a temperature at which the processing occurs to cause crystallization of the semiconductor material.

55. The method as claimed in claim 45, wherein the substrate is low temperature glass.

56. The method of claim 55, wherein the substrate is soda lime glass.

57. The method of claim 56, wherein the substrate is heated to a maximum temperature of 650° C.

58. The method as claimed in claim 45, wherein during or after the crystallization step, the substrate is heated to a temperature at which it will deform under gravity against a planar form, within a predetermined processing period, to reverse buckling caused by differential stress between the substrate and the semiconductor film.

59. The method of claim 58, wherein the substrate is heated to a maximum temperature between the strain point and he working point of the substrate.

60. The method as claimed in claim 45, wherein during or after the crystallization step, the substrate is heated to a temperature at which it will deform under gravity against a shaped form, within a predetermined processing period, to reverse buckling caused by differential stress between the substrate and the semiconductor film and to form the substrate to a shape determined by an end use of the device formed from the semiconductor layer.

61. The method of claim 60, wherein the substrate is heated to a maximum temperature between the strain point and -he working point of the substrate.

62. The method as claimed in claim 60, wherein the substrate is heated to a maximum temperature which is between the strain point and the sagging temperature of the substrate.

63. The method of claim 62, wherein the substrate is clamped at its edges at least while it is heated above the strain point and during the subsequent cooling step.

64. The method as claimed in claim 62, wherein the substrate is low temperature glass.

65. The method as claimed in claim 64, wherein the surface carrying the semiconductor film is cooled from the maximum temperature to below the strain point at a rate greater than the maximum rate at which isothermal cooling can occur.

66. The method as claimed in claim 64, wherein the substrate is 1–10 mm thick.

67. The method as claimed in claim 66, wherein the substrate is 1–5 mm thick.

68. The method as claimed in claim 67, wherein the surface carrying the semiconductor film is cooled from the maximum temperature to below the strain point at a rate greater than the maximum rate at which isothermal cooling can occur.

69. The method as claimed in claim 68, wherein the rate of cooling from the maximum temperature to below the strain point is in the range of 0.1° C./sec to 10° C./sec.

70. The method as claimed in claim 69, wherein the rate of cooling from the maximum temperature to below-the strain point is in the range of 0.5° C./sec to 10° C./sec.

71. The method of claim 65, wherein the substrate is soda lime glass.

72. The method as claimed in claim 71, wherein the substrate is heated to a maximum temperature of 620° C.

73. The method of claim 72, wherein the substrate is 2–4 mm thick.

74. The method as claimed in claim 73, wherein the rate of cooling from the maximum temperature to below the strain point is in the order of 4° C./sec.

75. The method as claimed in claim 45, wherein the semiconductor film is a film of material selected from doped or undoped silicon or silicon alloy.

76. The method as claimed in claim 45, wherein the silicon film is formed as a plurality of different doped layers of silicon forming one or moire rectifying junctions arranged as a photovoltaic device or solar cell.

77. The method as claimed in claim 76, wherein the lower limit of semiconductor film thickness is 0.1 $\mu$m.

78. The method as claimed in claim 76, wherein the lower limit of semiconductor film thickness is 1.0 $\mu$m.

79. The method as claimed in claim 76, wherein the lower limit of semiconductor film thickness is 3 $\mu$m.

80. The method as claimed in claim 76, wherein the upper limit of semiconductor film thickness is 100 $\mu$m.

81. The method as claimed in claim 76, wherein the upper limit of semiconductor film thickness is 15 $\mu$m.

82. The method as claimed in claim 76, wherein the strain point of the substrate is below or not significantly above the crystallisation temperature of the silicon film.

83. The method as claimed in claim 76, wherein the substrate has a strain point at or below 520° C.

84. The method of claim 83, wherein the substrate has an annealing point of 550° C.

85. The method of claim 84, wherein the substrate has a temperature co-efficient of 4–10 ppm/° C.

86. The method as claimed in claim 76, wherein the substrate is soda lime glass with a composition of 70–75% by weight $SiO_2$, 10–20% $Na_2O$, 3–15% CaO and less than 0.2% by weight $Fe_2O_3$.

87. The method as claimed in claim 86, wherein the composition has less than 0.1% by weight $Fe_2O_3$.

88. The method of claim 32, wherein the substrate has a temperature coefficient of 4–10 ppm/° C.

89. The method of claim 3 wherein the semiconductor film is separated from the glass substrate by a low strain point temperature film.

90. The method of claim 47 wherein the semiconductor film is separated from the glass substrate by a low strain point temperature film.

* * * * *